(12) United States Patent
Brown et al.

(10) Patent No.: US 9,244,793 B1
(45) Date of Patent: Jan. 26, 2016

(54) USING TARGET DATABASE SYSTEM STATISTICS IN EMULATION

(75) Inventors: Douglas P. Brown, Rancho Santa Fe, CA (US); Jeffrey S Shelton, San Diego, CA (US)

(73) Assignee: Teradata US, Inc., Dayton, OH (US)

( * ) Notice: Subject to any disclaimer, the term of this patent is extended or adjusted under 35 U.S.C. 154(b) by 1993 days.

(21) Appl. No.: 12/264,671

(22) Filed: Nov. 4, 2008

(51) Int. Cl.
G06F 9/45 (2006.01)
G06F 9/455 (2006.01)
G06F 11/26 (2006.01)
G06F 17/50 (2006.01)

(52) U.S. Cl.
CPC .......... G06F 11/261 (2013.01); G06F 17/5022 (2013.01)

(58) Field of Classification Search
CPC G06F 17/5036; G06F 17/5022; G06F 11/261
USPC ................ 703/23, 22; 707/999.002–999.003; 715/700
See application file for complete search history.

(56) References Cited

U.S. PATENT DOCUMENTS

| | | |
|---|---|---|
| 5,181,017 A | 1/1993 | Frey, Jr. et al. |
| 5,303,383 A | 4/1994 | Neches et al. |
| 5,398,199 A | 3/1995 | Lefons |
| 5,488,570 A | 1/1996 | Agarwal |
| 5,495,578 A | 2/1996 | Rohrbaugh et al. |
| 5,508,942 A | 4/1996 | Agarwal |
| 5,511,003 A | 4/1996 | Agarwal |
| 5,515,296 A | 5/1996 | Agarwal |
| 5,606,693 A | 2/1997 | Nilsen et al. |
| 5,625,815 A | 4/1997 | Maier et al. |
| 5,640,584 A | 6/1997 | Kandasamy et al. |
| 5,655,080 A | 8/1997 | Dias et al. |
| 5,819,066 A | 10/1998 | Bromberg et al. |
| 5,857,180 A | 1/1999 | Hallmark et al. |
| 5,857,192 A | 1/1999 | Fitting |
| 5,864,842 A | 1/1999 | Pederson et al. |
| 5,870,752 A | 2/1999 | Gibbons et al. |
| 5,872,904 A | 2/1999 | McMillen et al. |
| 5,873,079 A | 2/1999 | Davis, III et al. |
| 5,884,299 A | 3/1999 | Ramesh et al. |
| 5,940,819 A | 8/1999 | Beavin et al. |
| 5,943,666 A | 8/1999 | Kleewein et al. |
| 5,950,188 A | 9/1999 | Wildermuth |
| 5,970,495 A | 10/1999 | Baru et al. |
| 6,067,542 A | 5/2000 | Carino, Jr. |
| 6,208,955 B1 | 3/2001 | Provan et al. |
| 6,223,171 B1 | 4/2001 | Chaudhuri et al. |
| 6,272,487 B1 | 8/2001 | Beavin et al. |

(Continued)

OTHER PUBLICATIONS

Blasgen, Michael W., et al., "On the Evaluation of Queries in a Relational Data Base System", *IBM Research Report RJ 1745*, (Apr. 8, 1976),1-44.

(Continued)

*Primary Examiner* — Aniss Chad
(74) *Attorney, Agent, or Firm* — Howard Speight PLLC

(57) ABSTRACT

A method, system, and computer program are disclosed. Statistics are read from a data dictionary on a target system. The statistics include statistics for a table in a database in the target system. The statistics are exported to a test system separate from the target system. A command is received to use the statistics in emulation. In response the statistics are copied to a cache in the test system and the target system is emulated on the test system using the statistics in the test system's cache.

21 Claims, 6 Drawing Sheets

(56) References Cited

U.S. PATENT DOCUMENTS

| | | | |
|---|---|---|---|
| 6,289,334 B1 | 9/2001 | Reiner et al. | |
| 6,298,349 B1 | 10/2001 | Toyoshima et al. | |
| 6,370,522 B1 | 4/2002 | Agarwal et al. | |
| 6,381,604 B1 | 4/2002 | Caughran et al. | |
| 6,401,083 B1 | 6/2002 | Agarwal et al. | |
| 6,414,307 B1 | 7/2002 | Gerlach et al. | |
| 6,418,389 B2 | 7/2002 | Peter et al. | |
| 6,430,556 B1 | 8/2002 | Goldberg et al. | |
| 6,434,545 B1 | 8/2002 | MacLeod et al. | |
| 6,477,523 B1 | 11/2002 | Chiang | |
| 6,487,547 B1 | 11/2002 | Ellison et al. | |
| 6,507,842 B1 | 1/2003 | Grey et al. | |
| 6,564,209 B1 | 5/2003 | Dempski et al. | |
| 6,615,120 B1 | 9/2003 | Rother | |
| 6,618,719 B1 | 9/2003 | Andrei | |
| 6,662,312 B1 | 12/2003 | Keller | |
| 6,738,756 B1 | 5/2004 | Brown et al. | |
| 6,801,903 B2 | 10/2004 | Brown et al. | |
| 7,010,521 B2 | 3/2006 | Hinshaw et al. | |
| 7,155,428 B1 * | 12/2006 | Brown et al. | |
| 7,162,472 B2 | 1/2007 | Galindo-Legaria et al. | |
| 7,185,000 B1 | 2/2007 | Brown et al. | |
| 7,246,111 B1 | 7/2007 | Chaware et al. | |
| 7,370,043 B1 | 5/2008 | Shelton et al. | |
| 2003/0016237 A1 | 1/2003 | Hickey | |
| 2003/0149970 A1 | 8/2003 | Shanbhogue et al. | |
| 2004/0167891 A1 | 8/2004 | Galindo-Legaria et al. | |
| 2005/0210010 A1 | 9/2005 | Larson et al. | |

OTHER PUBLICATIONS

Blasgen, Michael W., et al., "Storage and Access in Relational Data Bases", *IBM Syst. J.* No. 4,(1977),363-377.

Bourbakis, N.G "Emulating Human Visual Perception for Measuring Difference in Images using an SPN Graph Approach", *IEEE Transactions on Systems, Man, and Cybernetics—Part B: Cybernetics*, Vo. 32, No. 2, (Apr. 1, 2002),191-201.

Brown, Douglas P., et al., "Analysis Method and Apparatus for a Parallel System", U.S. Appl. No. 09/608,977, filed Jun. 30, 2000.

Brown, Douglas P., et al., "Collecting and/or Presenting Demographics in a Database System", U.S. Appl. No. 09/976,632, filed Oct. 12, 2001.

Brown, Douglas P., et al., "Collecting Statistics in a Database System", U.S. Appl. No. 09/976,634, filed Oct. 12, 2001.

Brown, Douglas P., et al., "Emulating a Database System", U.S. Appl. No. 10/039,283, filed Dec. 31, 2001.

Brown, Douglas P., et al., "Index Selection in a Database System", U.S. Appl. No. 09/977,038, filed Oct. 12, 2001.

Brown, Douglas P., et al., "Method and Apparatus for Presenting Query Plans", U.S. Appl. No. 09/608,976, filed Jun. 30, 2000.

Chamberlin, D. D., et al., "Sequel 2: A Unified Approach to Data Definition, Manipulation, and Control", *IBM J. Res. Develop.*, (Nov. 1, 1976).

Chamberlin, D. D., et al., "Views, Authorization, and Locking in a Relational Data Base System", *National Computer Conference*, (1975),425-430.

Cheu, Dwight et al., "SQL Language Reference Manual", *Version 6.0*, Oracle,(Feb. 1, 1990),5-1 to 5-5 and 5-96 to 5-97.

Ghosh, Saumyendu et al., "Global Implementation of ERP Software-Critical Success Factors on Upgrading Technical Infrastructure", *IEMC '03, Managing Technology Driven Organization Side of Innovation and Change*, (Nov. 2-4, 2003),320-324.

Kitsuregawa, Masaru et al., "Query Execution for Large Relations on Functional Disk System", *Institute of Industrial Science, University of Tokyo*, (1989),159-167.

Klindt, Jerry et al., "Copying a Portion of a Database Structure Associated with a Query", U.S. Appl. No. 09/892,837, (Jun. 27, 2001).

NCR Corporation, "Teradata Performance Services", *Brochure*, (2002).

Quarterman, John S., et al., "Notable Computer Networks", *Communications of the ACM*, vol. 29, No. 10, (1986),932-971.

Selinger, P. G., et al., "Access Path Selection in a Relational Database Management System", *ACM*, (1979),23-34.

Wong, Eugene et al., "Decomposition—A Strategy for Query Processing", *ACM Transactions on Database Systems*, vol. 1, No. 3, (Sep. 1, 1976),223-241.

\* cited by examiner

USING TARGET DATABASE SYSTEM STATISTICS IN EMULATION

BACKGROUND

It is sometimes useful to emulate the operation of one database system, i.e., a target database system, on a test database system. Such emulations can be helpful in troubleshooting the processing of requests, i.e., queries and utilities, and in testing proposed hardware or software changes without interrupting operations on the target database system.

The test database system often uses an optimizer to generate parallel query plans or strategies for executing a request and then to select the plan to execute. Such optimizers often use table statistics, which are typically stored in a data dictionary, in their analysis. One conventional approach for providing such data to an optimizer in a test database system is to extract table statistics from the target database system's data dictionary, store the table statistics in the test database system's data dictionary, and run the emulation on the test database system. Using such an approach when the test system is being used to emulate more than one target database system is a challenge especially when there are many users logged on to the test system.

SUMMARY

In general, in one aspect, the invention features a method comprising reading statistics from a data dictionary on a target system. The statistics include statistics for a table in a database in the target system. The method includes exporting the statistics to a test system separate from the target system. The method further includes receiving a command to use the statistics in emulation and, in response copying the statistics to a cache in the test system and emulating the target system on the test system using the statistics in the test system's cache.

Implementations may include one or more of the following. Receiving a command to use the stored statistics in emulation may include receiving a command specifying a level of emulation. Copying the statistics to a cache in the test system may include copying the statistics to a segment in the cache in the test system corresponding to the level of emulation. Emulating the target system on the test system using the statistics in the test system's cache may include emulating the target system on the test system using the statistics in the segment in the cache corresponding to the level of emulation. Receiving a command to use the stored statistics in emulation may include receiving a command in which the specified level of emulation is selected from a group of levels of emulation consisting of system level, interface processor level, session level, and request level. Receiving a command to use the stored statistics may include receiving the command from a first user. Copying the statistics to the segment in the cache in the test system corresponding to the level of emulation may include copying a private version of the statistics to the segment in the cache in the test system corresponding to the level of emulation, the private version of the statistics being accessible only by the first user and not by any other user. Emulating the target system on the test system may include using the private version of the statistics in the segment in the cache corresponding to the level of emulation. Emulating the target system on the test system using the private version of the statistics in the segment in the cache corresponding to the level of emulation may include optimizing the processing of a first request submitted by the first user using the private version of the statistics and optimizing the processing of a second request submitted by a second user using statistics other than the private version of the statistics. Receiving a command to use the stored statistics in emulation may include receiving a command specifying the database and the table. Copying the statistics to a cache in the test system may include copying the statistics for the table to the cache. Emulating the target system on the test system using the statistics in the test system's cache may include emulating the target system on the test system using the statistics for the table in the cache. Receiving a command to use the stored statistics in emulation may include receiving a command from a user specifying the database, the table, and a level of emulation. Copying the statistics to a cache in the test system may include copying the statistics for the table to a segment in the cache corresponding to the level of emulation. Emulating the target system on the test system using the statistics in the test system's cache may include emulating the target system on the test system using the statistics for the table in the segment in the cache corresponding to the level of emulation.

In general, in another aspect, the invention features a database system comprising one or more nodes, a plurality of CPUs, each of the one or more nodes providing access to one or more CPUs. The database system further includes a plurality of virtual processes, each of the one or more CPUs providing access to one or more virtual processes. Each virtual process is configured to manage data, including rows from the set of database table rows, stored in one of a plurality of data-storage facilities. The database system further includes a process configured to emulate a target system on a test system by reading statistics from a data dictionary on a target system. The statistics include statistics for a table in a database in the target system. The process further includes exporting the statistics to a test system separate from the target system. The process further includes receiving a command to use the statistics in emulation and, in response copying the statistics to a cache in the test system and emulating the target system on the test system using the statistics in the test system's cache.

In general, in another aspect, the invention features a computer program, stored in a computer-readable tangible medium. The computer program includes executable instructions that cause a computer to read statistics from a data dictionary on a target system. The statistics include statistics for a table in a database in the target system. The computer program includes executable instructions that cause a computer to export the statistics to a test system separate from the target system. The computer program includes executable instructions that cause a computer to receive a command to use the statistics in emulation and, in response copy the statistics to a cache in the test system and emulate the target system on the test system using the statistics in the test system's cache.

DETAILED DESCRIPTION

Figure 1:
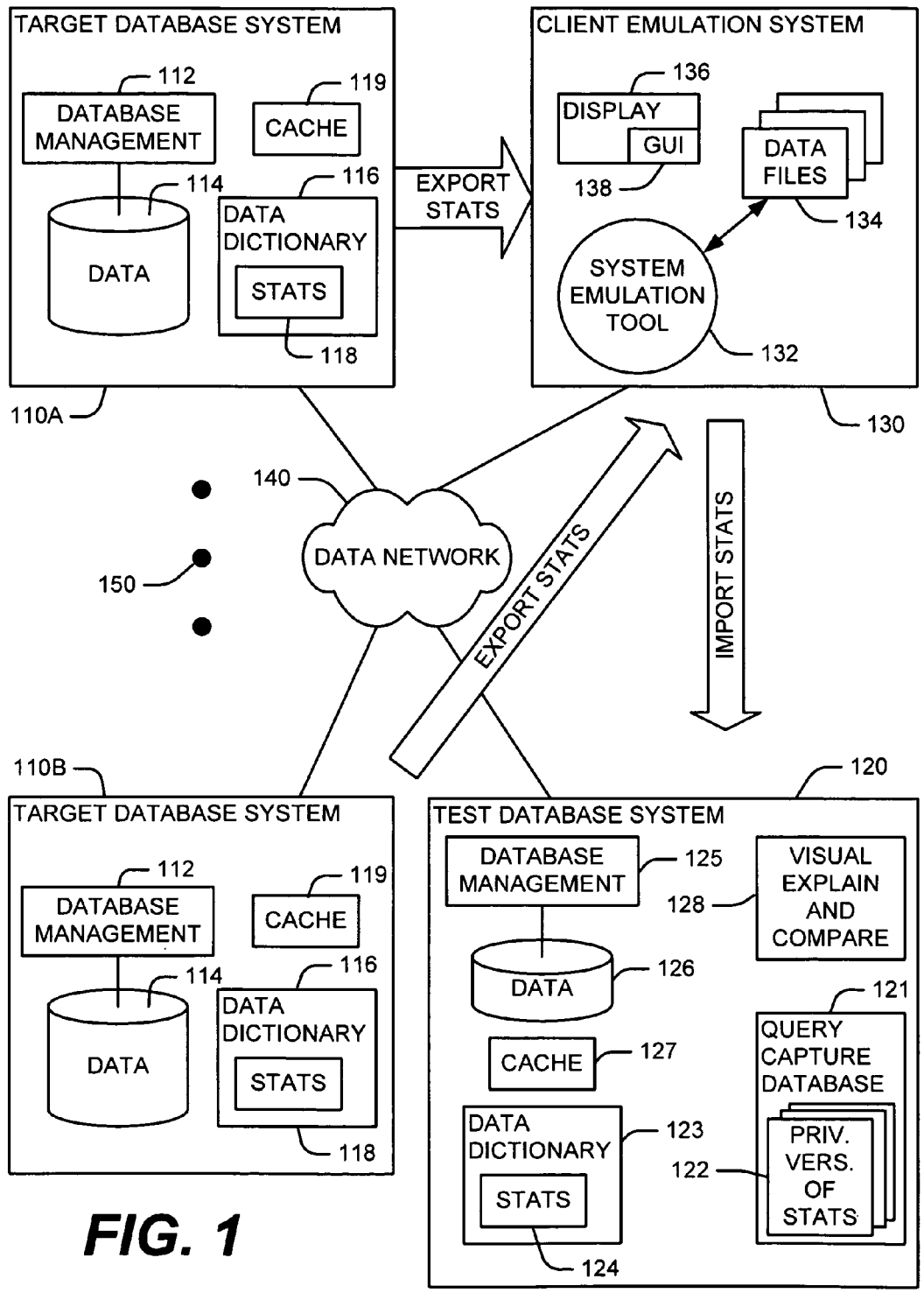
FIG. 1 is a block diagram of one embodiment of an interconnected group of systems comprising a plurality of target database systems, a client emulation system, and a test database system.

In one embodiment, shown in FIG. 1, one or more target database systems (110A, 110B), a test database system 120, and a client emulation system 130 communicate through a data network 140. In one embodiment, a system emulation tool 132 is executable within the client emulation system 130. In one embodiment, the client emulation system 130 is integrated with the test system 120 onto a single platform.

In one embodiment, the target database system 110A is located at a first customer site, while the target database system 110B is located at a second customer site. In one embodiment, other target database systems, represented by the ellipsis 150, are located at other customer sites. Each target database system 110 includes database management software 112 that manages access of data in a respective database 114. In accordance with some embodiments, the database 114 is distributed across plural access modules and corresponding storage modules in each target database system 110. For example, if the target database system 110A is a TERADATA® database system from Teradata Corporation, then the access modules are Access Module Processes (AMPs). The target database system includes one node or plural nodes, with each node capable of executing one or plural access modules.

In one embodiment, each target database system 110 includes a data dictionary 116, which includes statistics 118. In one embodiment, the statistics 118 include data regarding tables managed by the database management software 112 such as:

Table-column statistics.
The structure of data in the database.
Number of rows in a table.
The data demographics of a table.
Highest/lowest values of a column.
Number of nulls in a table.
Number of intervals in a table.
Total number of values in a table.
The mode of values in a table.
The frequency of occurrence of the mode value in a table.

In one embodiment, each target database system 110 includes a cache 119. In one embodiment, the cache 119 is a relatively fast memory where the database management software 112 looks for data that has been recently accessed before searching relatively slow mass storage devices, such as disk drives or optical drives.

As mentioned above, in one embodiment, the target database systems 110 are coupled to a data network 140. In one embodiment, the data network 140 is a private network (such as a local area network or wide area network). In one embodiment, the data network is a public network (such as the Internet). In one embodiment, the emulation client system 130 is also coupled to the data network 140. In one embodiment, various data files 134 stored in the emulation client system 130 contain statistics data exported from respective database systems 110. In one embodiment, the system emulation tool 132, executable in the emulation client system 130, exports statistics data from the target database systems 110A, 110B over the data network 140. In one embodiment, the system emulation tool imports the statistics data into the test system 120. In one embodiment, if the client emulation system 130 is integrated with the test database system 120, the system emulation tool 132 and data files 134 are located on the same platform as the components of the test system 110. In one embodiment, the statistics data imported to the test system 120 are imported into the query capture database (QCD) 121 as private versions of statistics 122. In one embodiment, each target database system 110 being emulated has its own private version of statistics 122 stored in the QCD 121.

In one embodiment, the test database system 120 includes a data dictionary 123 that contains statistics 124. In one embodiment, the test database system's QCD 121 is a separate database from its data dictionary 123. In one embodiment, the statistics 124 contain statistics such as those described above with respect to element 118 collected for tables stored on the test database system 120.

In one embodiment, database management software 125 in the test system 120 includes an optimizer, which selects a query plan for a given query that accesses data in a database 126 managed by the database management software 125. In one embodiment, the optimizer uses the statistics 124 stored in the data dictionary 123 to identify and select the most efficient query plan (from among plural query plans) for a given query. In one embodiment, the optimizer checks a cache 127 for recently accessed data before accessing the statistics 124 in the data dictionary 123.

In one embodiment, the test database system 120 includes a visual explain and compare module 128 for displaying query plan(s) selected by the optimizer in a user interface of the test system. In one embodiment, instead of executing in the test database system 120, the visual explain and compare module 128 executes in the emulation client system 130, as represented by the display 136 and graphical user interface (GUI) 138. In another embodiment, instead of using the visual explain and compare module 128, some other user interface is provided to present the results of query plan selection by the optimizer. In one embodiment, if the visual explain and compare module 128 is used, the graphical user interface 138 is provided, in which steps of the query plan are depicted as icons or other image elements, with icons connected by lines to represent the flow of the steps in the query plan. The icons that are displayed by the visual explain and compare module 128 are designed to represent database operations performed on data rows such as relational algebra operations (e.g., select, project, join); physical algebraic operators such as nested join, merge join, hash join, and so forth; data movement/organization operations such as sorts, redistribution, duplication; and database objects such as tables and views.

Another feature of the visual explain and compare module 128, in accordance with one embodiment, is the ability to graphically or visually compare plural query plans for a given query, with the plural query plans generated under different conditions. This provides the user with the ability to analyze differences between query plans.

Figure 2:
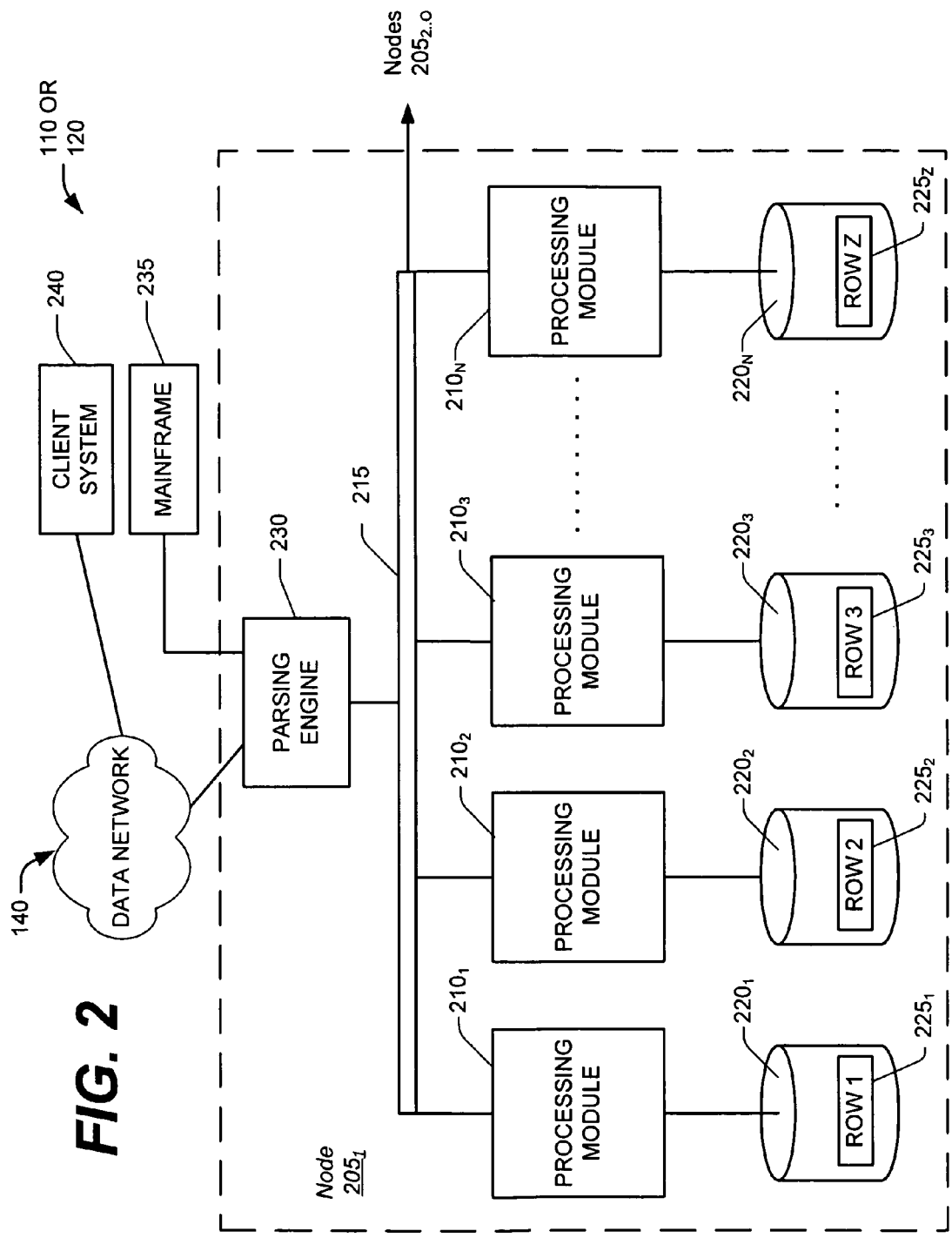
FIG. 2 is a block diagram of a node of a parallel processing database system.

FIG. 2 shows a sample architecture for one node $205_1$ of one of the target database systems 110 or the test database system 120. In one embodiment, the test database system 120 has a much simpler architecture, such as a single laptop computer running a Windows operating system. Similarly, in one embodiment, one or more of the target database systems 110 has a different or simpler architecture.

Returning to the sample architecture shown in FIG. 2, the DBS node $205_1$ includes one or more processing modules $210_{1 \ldots N}$, connected by a network 215, that manage the storage and retrieval of data in data-storage facilities $220_{1 \ldots N}$. Each of the processing modules $210_{1 \ldots N}$ may be one or more physical processors or each may be a virtual processor, with one or more virtual processors running on one or more physical processors.

For the case in which one or more virtual processors are running on a single physical processor, the single physical processor swaps between the set of N virtual processors.

For the case in which N virtual processors are running on an M-processor node, the node's operating system schedules the N virtual processors to run on its set of M physical processors. If there are 4 virtual processors and 4 physical processors, then typically each virtual processor would run on its own physical processor. If there are 8 virtual processors and 4 physical processors, the operating system would schedule the 8 virtual processors against the 4 physical processors, in which case swapping of the virtual processors would occur.

Each of the processing modules $210_{1...N}$ manages a portion of a database that is stored in a corresponding one of the data-storage facilities $220_{1...N}$. Each of the data-storage facilities $220_{1...N}$ includes one or more disk drives. The DBS may include multiple nodes $205_{2...N}$ in addition to the illustrated node $205_1$, connected by extending the network 215.

The system stores data in one or more tables in the data-storage facilities $220_{1...N}$. The rows $225_{1...Z}$ of the tables are stored across multiple data-storage facilities $220_{1...N}$ to ensure that the system workload is distributed evenly across the processing modules $210_{1...N}$. A parsing engine 230 organizes the storage of data and the distribution of table rows $225_{1...Z}$ among the processing modules $210_{1...N}$. Similar to AMPs, the system can be configured to support a large number of parsing engines. Parsing engines are referred to as interface processors (IFPs). The parsing engine 230 also coordinates the retrieval of data from the data-storage facilities $220_{1...N}$ in response to queries received from a user at a mainframe 235 or a client computer 240. The target database systems 110 and/or the test database system 120 usually receive queries and commands to build tables in a standard format, such as SQL.

In one implementation, the rows $225_{1...Z}$ are distributed across the data-storage facilities $220_{1...N}$ by the parsing engine 230 in accordance with their primary index. The primary index defines the columns of the rows that are used for calculating a hash value. The function that produces the hash value from the values in the columns specified by the primary index is called the hash function. Some portion, possibly the entirety, of the hash value is designated a "hash bucket". The hash buckets are assigned to data-storage facilities $220_{1...N}$ and associated processing modules $210_{1...N}$ by a hash bucket map. The characteristics of the columns chosen for the primary index determine how evenly the rows are distributed.

Figure 3:
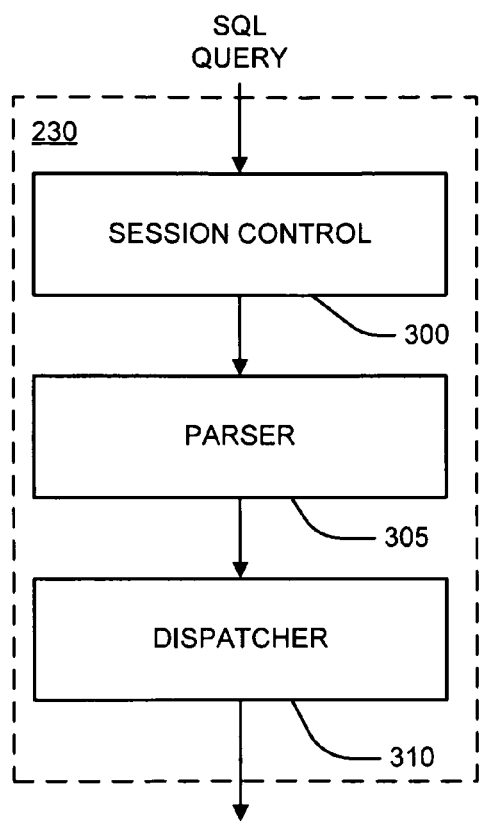
FIG. 3 is a block diagram of a virtual parsing engine.

In an example system, the parsing engine 230 is made up of three components: a session control 300, a parser 305, and a dispatcher 310, as shown in FIG. 3. Session control 300 provides a logon and logoff function. It accepts a request for authorization to access the database, verifies it, and then either allows or disallows the access.

Figure 4:
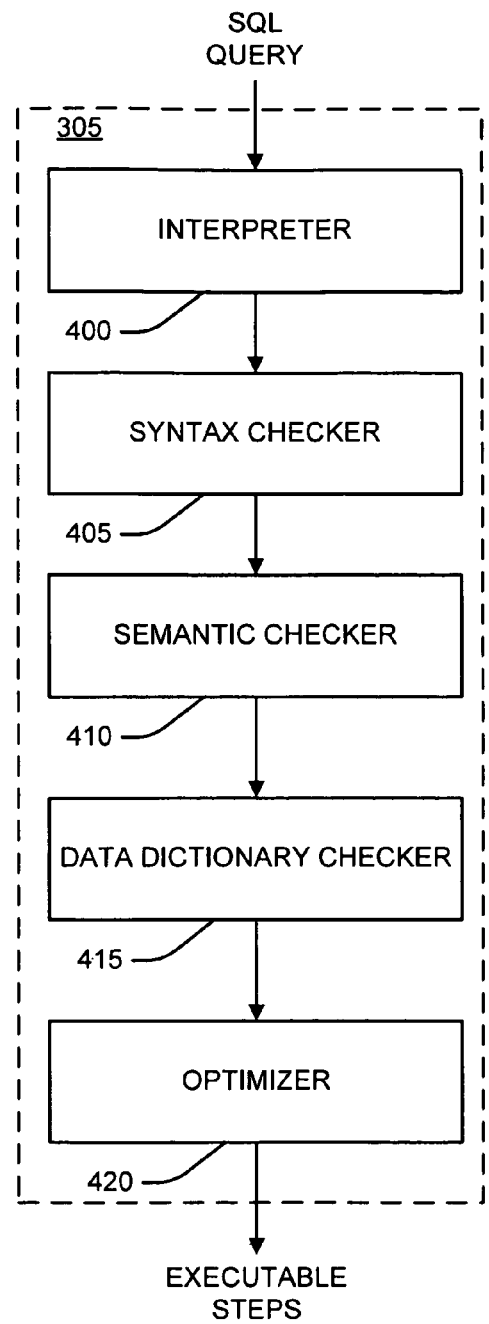
FIG. 4 is a block diagram of a parser.

Once session control 300 allows a session to begin, a user may submit a SQL request, which is routed to parser 305. As illustrated in FIG. 4, parser 305 interprets the SQL request (block 400), checks it for proper SQL syntax (block 405), evaluates it semantically (block 410), and consults a data dictionary to ensure that all of the objects specified in the SQL request actually exist and that the user has the authority to perform the request (block 415). Finally, the parser 405 runs an optimizer (block 420), which develops, for example, the least expensive plan to perform the request.

Figure 5:
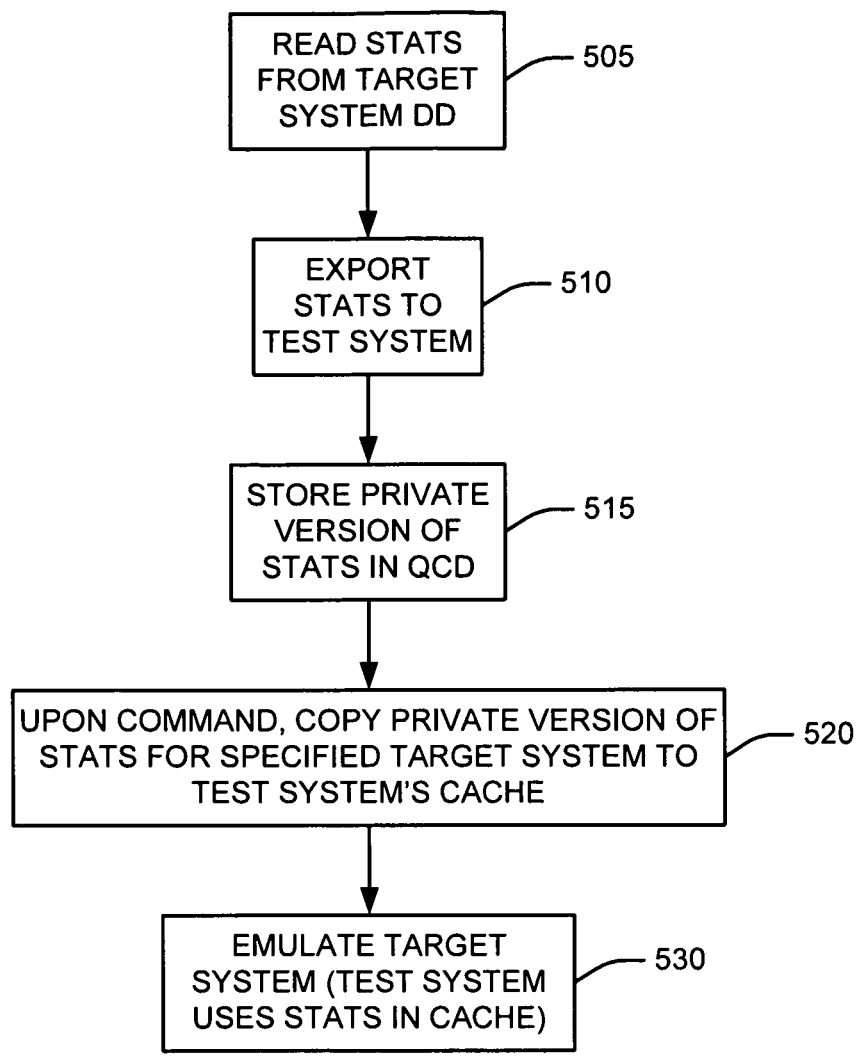
FIGS. 5 and 6 are flow charts illustrating the processing associated with using target database system statistics in emulation.

In use, in one embodiment, as shown in FIG. 5, statistics are read from the data dictionaries 116 of the target database systems 110 to be emulated (block 505). In one embodiment, the reading process is coordinated by the system emulation tool 132. In one embodiment, the reading process is coordinated by a process running on each of the target database systems 110. In one embodiment, the selection of target database systems 110 to be emulated is made through the GUI 138 on the display 136 associated with the client emulation system 130.

In one embodiment, the statistics are exported from the target database systems 110 to the client emulation system 130, as indicated by the arrows from the target database systems 110A, 110B to the client emulation system 130 (block 510). In one embodiment, other information, including DDL statements, DML statement, cost-related information, actual data associated with the database 114, and/or random samples of that data are exported from the target database systems 110A, 110B to the client emulation system 130, as described in U.S. Pat. No. 7,155,428. In one embodiment, the exporting process is coordinated by the system emulation tool 132. In one embodiment, the exporting process can be controlled and monitored through the GUI 138 on the display 136.

In one embodiment the statistics are stored in the QCD 121 in the test database system (block 515). In one embodiment, a separate private version of the statistics 122 is maintained for each target database system 110 being emulated.

In one embodiment, upon command, the private version of the statistics for a target database system specified in the command is copied into a cache 127 in the test database system 120 (block 520). The command is described in more detail below.

In one embodiment, the test database system 120 emulates the target database system 110 (block 530). When the test database system's database management software 125 attempts to read the statistics 124 from its data dictionary 123 it will first check the cache 127, where it will find the statistics for the target database system 110. It will use those statistics rather than those stored in the data dictionary 123.

As a result, in one embodiment, the statistics 124 in the test database system's data dictionary 123 are not disturbed. Further, in one embodiment, each simulation of a target database system 110 can proceed with its own set of statistics without disturbing the statistics for one or more of the other target database systems, which maintains the integrity of the system when multiple users are logged on to the test system. That is, using this technique, the emulations for one user need not be effected by emulations for another user.

Figure 6:
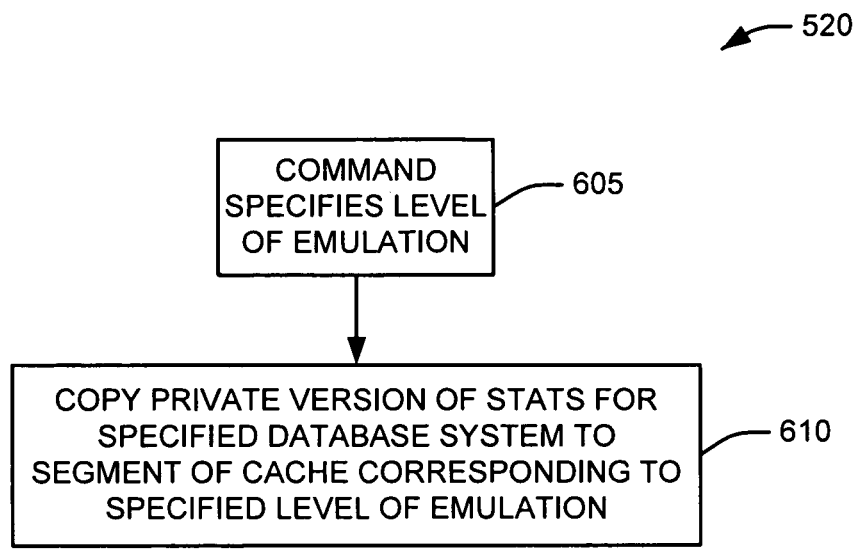

In one embodiment of block 520, shown in FIG. 6, the command specifies a level of emulation (block 605). In one embodiment, the command is processed by copying the private version of the statistics for the specified database to a segment of the cache, which is described below, corresponding to the specified level of emulation (block 610).

Figure 7:
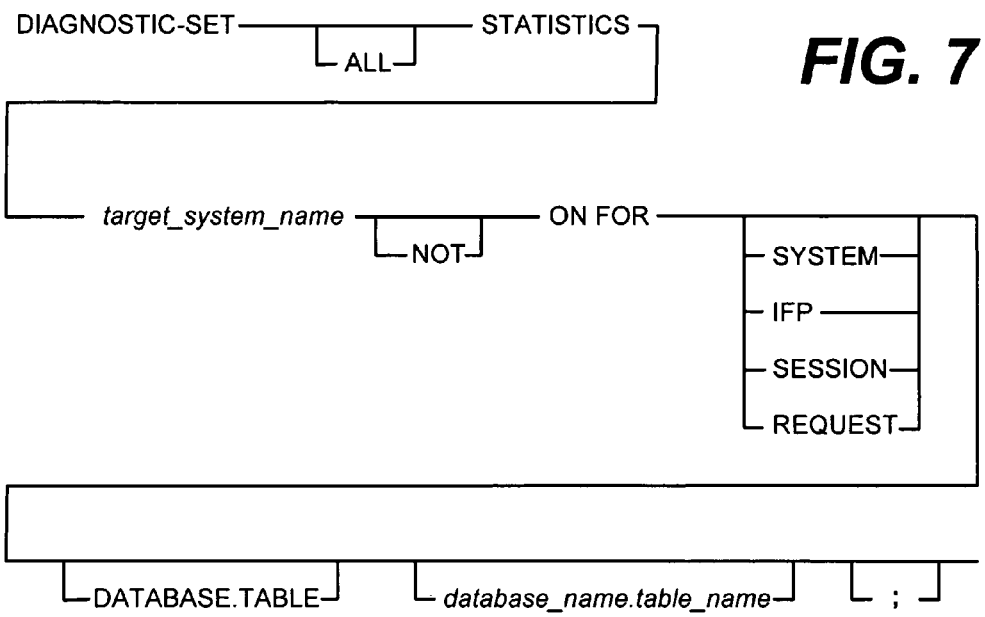
FIG. 7 illustrates a command syntax.

One embodiment of the syntax of the command is shown in FIG. 7. In FIG. 7, words in uppercase letters, such as "DIAGNOSTIC-SET" are key words. Words in lowercase italics, such as "target_system_name" are variables such as a system, database, or table name. The path of the syntax is shown as a line. The path proceeds from left to right and wraps from the end of one line to the beginning of the next. Optional items, such as "ALL" and "NOT" appear below the path. Where a choice is available, the choices are shown in a stack, such as "SYSTEM," "IFP," "SESSION," and "REQUEST."

In one embodiment, the variable "target_system_name" is the name of the target system to be emulated. In one embodiment, the variable "table_name" is the name of the table for which statistics emulation is to be performed. In one embodiment, the variable "database_name" is the name of the database in which the table name is defined.

Figure 8:
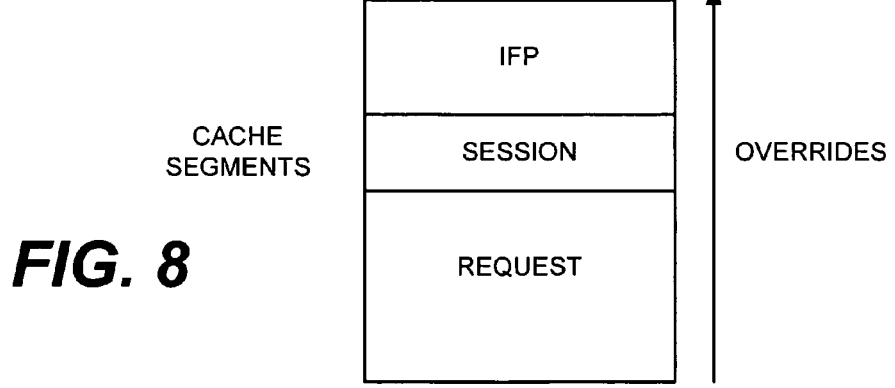
FIG. 8 illustrates a hierarchy for cache segments.

In one embodiment, the cache 127 is segmented into 4 levels of segments, as shown in FIG. 8. In one embodiment, the top level segment is the SYSTEM level segment. In one embodiment, there is only one SYSTEM level segment. In one embodiment, the second level is the IFP level. In one embodiment, the third level is the SESSION level. In one embodiment, the fourth and final level is the REQUEST level. FIG. 8 is not intended to show the relative sizes of the different cache segments. In one embodiment, the size of the cache segments is determined dynamically to provide the size needed at any particular time. At one point in time, for example, in one embodiment, the SYSTEM level segment may be larger than any other segment. At a subsequent time, the SYSTEM level segment may be the smallest segment. Further, in one embodiment, all of the cache segments except the SYSTEM level segment can contain more than one set of stats.

In one embodiment, issuing the following command:
DIAGNOSTIC-SET ALL STATISTICS target_database_system_110A ON FOR SYSTEM;
causes all of the statistics associated with target database system 110A to be copied from the QCD into the SYSTEM level segment of the cache. In one embodiment, issuing the following command:
DIAGNOSTIC-SET ALL STATISTICS target_database_system_110A ON FOR IFP;
causes all of the statistics associated with target database system 110A to be copied from the QCD into an IFP level segment of the cache. In one embodiment, issuing the following command:
DIAGNOSTIC-SET ALL STATISTICS target_database_system_110A ON FOR SESSION;
causes all of the statistics associated with target database system 110A to be copied from the QCD into a SESSION level segment of the cache. In one embodiment, issuing the following command:
DIAGNOSTIC-SET ALL STATISTICS target_database_system_110A ON FOR REQUEST;
causes all of the statistics associated with target database system 110A to be copied from the QCD into a REQUEST level segment of the cache.

In one embodiment, issuing the following command:
DIAGNOSTIC-SET STATISTICS target_database_system_110A ON FOR [SYSTEM, IFP, SESSION, REQUEST] - - - DATABASE.TABLE - - - database_1.table_a;
causes the statistics associated with database_1.table_a on target database system 110A to be copied from the QCD into the selected (the brackets indicate a selection) level segment of the cache. Including the keyword "NOT" in any of the above commands causes statistics for the specified scope level to be disabled. If all of the scope levels are disabled, the test system uses the statistics in the test system's data dictionary during optimization.

In one embodiment, the lower layers override the higher layers. For example, assume that a first user (of many possible users) of the test database system issues a DIAGNOSTIC-SET STATISTICS command at the SYSTEM level causing statistics from target database system 110A to be copied from the QCD into the SYSTEM level segment of the cache 127. If no other DIAGNOSTIC-SET STATISTICS commands have been issued, the statistics stored in the SYSTEM level segment of the cache 127 apply to all users of the system.

Assume that a second user of the system issues a DIAGNOSTIC-SET STATISTICS command at the IFP level causing statistics from target database system 110b to be copied from the QCD into the IFP level segment of the cache 127. In that case, in one embodiment, the IFP level segment of the cache 127 would override the SYSTEM level segment of the cache 127 for the second user assuming the second user is logged on to that IFP. A third user could issue a DIAGNOSTIC-SET STATISTICS command at the IFP level and the resulting statistics would apply for the third user. A fourth user could issue a DIAGNOSTIC-SET STATISTICS command at the SESSION level and the resulting statistics would override the SYSTEM and SESSION level statistics for that user (i.e., the fourth user). A fifth user could issue a DIAGNOSTIC-SET STATISTICS command at the REQUEST level and the resulting statistics would override the SYSTEM, IFP, and SESSION levels for that user (i.e., the fifth user) for that request.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method comprising:
reading statistics from a data dictionary on a target system, the statistics including statistics for a table in a database in the target system;
exporting the statistics to a test system separate from the target system;
storing the exported statistics in a query capture database in the test system;
receiving a command to use the stored statistics in emulation, the command specifying one of a plurality of possible levels of emulation for which emulation includes copying the stored statistics from the query capture database to a cache in the test system and, in response:
copying the stored statistics from the query capture database to a cache in the test system; and
emulating the target system on the test system using the statistics in the test system's cache.

2. The method of claim 1 wherein:
the cache in the test system is segmented into a plurality of segments, each of the segments corresponding to a respective level of emulation;
copying the statistics to a cache in the test system comprises copying the statistics to a segment in the cache in the test system corresponding to the level of emulation; and
emulating the target system on the test system using the statistics in the test system's cache comprises emulating the target system on the test system using the statistics in the segment in the cache corresponding to the level of emulation.

3. The method of claim 2 wherein:
receiving a command to use the stored statistics comprises receiving the command from a first user;
copying the statistics to the segment in the cache in the test system corresponding to the level of emulation comprises copying a private version of the statistics to the segment in the cache in the test system corresponding to the level of emulation, the private version of the statistics being accessible only by the first user and not by any other user; and
emulating the target system on the test system comprises using the private version of the statistics in the segment in the cache corresponding to the level of emulation.

4. The method of claim 3 wherein emulating the target system on the test system using the private version of the statistics in the segment in the cache corresponding to the level of emulation comprises:
optimizing the processing of a first request submitted by the first user using the private version of the statistics; and optimizing the processing of a second request submitted by a second user using statistics other than the private version of the statistics.

5. The method of claim 1 where receiving a command to use the stored statistics in emulation comprises:
receiving a command in which the specified level of emulation is selected from a group of levels of emulation consisting of system level, interface processor level, session level, and request level.

6. The method of claim 1 wherein:
receiving a command to use the stored statistics in emulation comprises receiving a command specifying the database and the table;
copying the statistics to a cache in the test system comprises copying the statistics for the table to the cache; and
emulating the target system on the test system using the statistics in the test system's cache comprises emulating the target system on the test system using the statistics for the table in the cache.

7. The method of claim 1 wherein:
receiving a command to use the stored statistics in emulation comprises receiving a command from a user specifying the database, the table, and a level of emulation;
copying the statistics to a cache in the test system comprises copying the statistics for the table to a segment in the cache corresponding to the level of emulation; and
emulating the target system on the test system using the statistics in the test system's cache comprises emulating the target system on the test system using the statistics for the table in the segment in the cache corresponding to the level of emulation.

8. A database system comprising:
one or more nodes;
a plurality of CPUs, each of the one or more nodes providing access to one or more CPUs;
a plurality of virtual processes, each of the one or more CPUs providing access to one or more virtual processes;
each virtual process configured to manage data, including rows from a set of database table rows, stored in one of a plurality of data-storage facilities;
a process configured to emulate a target system on a test system by:
reading statistics from a data dictionary on a target system, the statistics including statistics for a table in a database in the target system;
exporting the statistics to a test system separate from the target system;
storing the exported statistics in a query capture database in the test system;
receiving a command to use the stored statistics in emulation, the command specifying one of a plurality of possible levels of emulation for which emulation includes copying the stored statistics from the query capture database to a cache in the test system and, in response:
copying the stored statistics from the query capture database to a cache in the test system; and
emulating the target system on the test system using the statistics in the test system's cache.

9. The database system of claim 8 wherein:
the cache in the test system is segmented into a plurality of segments, each of the segments corresponding to a respective level of emulation;
copying the statistics to a cache in the test system comprises copying the statistics to a segment in the cache in the test system corresponding to the level of emulation; and
emulating the target system on the test system using the statistics in the test system's cache comprises emulating the target system on the test system using the statistics in the segment in the cache corresponding to the level of emulation.

10. The database system of claim 9 wherein:
receiving a command to use the stored statistics in emulation comprises receiving the command from a first user;
copying the statistics to the segment in the cache in the test system corresponding to the level of emulation comprises copying a private version of the statistics to the segment in the cache in the test system corresponding to the level of emulation, the private version of the statistics being accessible only by the first user and not by any other user; and
emulating the target system on the test system comprises using the private version of the statistics in the segment in the cache corresponding to the level of emulation.

11. The database system of claim 10 wherein emulating the target system on the test system using the private version of the statistics in the segment in the cache corresponding to the level of emulation comprises:
optimizing the processing of a first request submitted by the first user using the private version of the statistics; and
optimizing the processing of a second request submitted by a second user using statistics other than the private version of the statistics.

12. The database system of claim 8 where receiving a command to use the stored statistics in emulation comprises:
receiving a command in which the specified level of emulation is selected from a group of levels of emulation consisting of system level, interface processor level, session level, and request level.

13. The database system of claim 8 wherein:
receiving a command to use the stored statistics comprises receiving a command specifying the database and the table;
copying the statistics to a cache in the test system comprises copying the statistics for the table to the cache; and
emulating the target system on the test system using the statistics in the test system's cache comprises emulating the target system on the test system using the statistics for the table in the cache.

14. The database system of claim 8 wherein:
receiving a command to use the stored statistics comprises receiving a command from a user specifying the database, the table, and a level of emulation;
copying the statistics to a cache in the test system comprises copying the statistics for the table to a segment in the cache corresponding to the level of emulation; and
emulating the target system on the test system using the statistics in the test system's cache comprises emulating the target system on the test system using the statistics for the table in the segment in the cache corresponding to the level of emulation.

15. A non-transitory computer-readable storage medium, including instructions that cause a computer to:
read statistics from a data dictionary on a target system, the statistics including statistics for a table in a database in the target system;

export the statistics to a test system separate from the target system;

store the exported statistics in a query capture database in the test system;

receive a command to use the stored statistics in emulation, the command specifying one of a plurality of possible levels of emulation for which emulation includes copying the stored statistics from the query capture database to a cache in the test system and, in response:

copy the stored statistics from the query capture database to a cache in the test system; and emulate the target system on the test system using the statistics in the test system's cache.

16. The non-transitory computer-readable storage medium of claim 15 wherein:

the cache in the test system is segmented into a plurality of segments, each of the segments corresponding to a respective level of emulation;

when copying the statistics to a cache in the test system the computer copies the statistics to a segment in the cache in the test system corresponding to the level of emulation; and when emulating the target system on the test system using the statistics in the test system's cache the computer emulates the target system on the test system using the statistics in the segment in the cache corresponding to the level of emulation.

17. The non-transitory computer-readable storage medium of claim 16 whereas:

when receiving a command to use the stored statistics in emulation the computer receives the command from a first user;

when copying the statistics to the segment in the cache in the test system corresponding to the level of emulation the computer copies a private version of the statistics to the segment in the cache in the test system corresponding to the level of emulation, the private version of the statistics being accessible only by the first user and not by any other user; and when emulating the target system on the test system using the private version of the statistics in the segment in the cache corresponding to the level of emulation.

18. The non-transitory computer-readable storage medium of claim 17 wherein when emulating the target system on the test system using the private version of the statistics in the segment in the cache corresponding to the level of emulation the computer:

optimizes the processing of a first request submitted by the first user using the private version of the statistics; and optimizes the processing of a second request submitted by a second user using statistics other than the private version of the statistics.

19. The non-transitory computer-readable storage medium of claim 15 wherein when receiving a command to use the stored statistics in emulation the computer:

receives a command in which the specified level of emulation is selected from a group of levels of emulation consisting of system level, interface processor level, session level, and request level.

20. The non-transitory computer-readable storage medium of claim 15 wherein when:

receiving a command to use the stored statistics the computer receives a command specifying the database and the table;

copying the statistics to a cache in the test system the computer copies the statistics for the table to the cache; and emulating the target system on the test system using the statistics in the test system's cache the computer emulates the target system on the test system using the statistics for the table in the cache.

21. The non-transitory computer-readable storage medium of claim 15 wherein when:

receiving a command to use the stored statistics the computer receives a command from a user specifying the database, the table, and a level of emulation;

copying the statistics to a cache in the test system the computer copies the statistics for the table to a segment in the cache corresponding to the level of emulation; and emulating the target system on the test system using the statistics in the test system's cache the computer emulates the target system on the test system using the statistics for the table in the segment in the cache corresponding to the level of emulation.

* * * * *